(12) United States Patent
Geddes et al.

(10) Patent No.: US 9,244,762 B1
(45) Date of Patent: *Jan. 26, 2016

(54) METHOD AND APPARATUS FOR FLEXIBLE BUFFERS IN AN XOR ENGINE

(71) Applicant: Marvell International Ltd., Hamilton (BM)

(72) Inventors: David Geddes, Fremont, CA (US); Xinhai Kang, Milpitas, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/584,970

(22) Filed: Dec. 29, 2014

Related U.S. Application Data

(63) Continuation of application No. 13/748,078, filed on Jan. 23, 2013, now Pat. No. 8,935,593, which is a continuation of application No. 12/403,243, filed on Mar. 12, 2009, now Pat. No. 8,370,717.

(60) Provisional application No. 61/043,227, filed on Apr. 8, 2008.

(51) Int. Cl.
  *G06F 11/10* (2006.01)
  *H03M 13/09* (2006.01)

(52) U.S. Cl.
  CPC ........ *G06F 11/1004* (2013.01); *G06F 11/1076* (2013.01); *H03M 13/096* (2013.01)

(58) Field of Classification Search
  CPC .......... G06F 11/1076; G06F 2211/105; G06F 2211/1057; G06F 11/1004; H03M 13/096
  USPC ................. 714/758, 766, 770, 781, 800–804; 708/492
  See application file for complete search history.

(56) References Cited

U.S. PATENT DOCUMENTS

| 4,789,994 A | 12/1988 | Randall et al. |
| 4,888,691 A | 12/1989 | George et al. |
| 5,426,736 A | 6/1995 | Guineau, III |
| 5,509,134 A | 4/1996 | Fandrich et al. |
| 5,640,596 A | 6/1997 | Takamoto et al. |
| 5,644,786 A | 7/1997 | Gallagher et al. |
| 5,687,390 A | 11/1997 | McMillan, Jr. |
| 5,701,516 A | 12/1997 | Cheng et al. |
| 5,809,543 A | 9/1998 | Byers et al. |
| 5,835,783 A | 11/1998 | Grimsrud |

(Continued)

OTHER PUBLICATIONS

Yokota, H.; Goto, M., "FBD: a fault-tolerant buffering disk system for improving write performance of RAID5 systems," Dependable Computing, 1999. Proceedings. 1999 Pacific Rim International Symposium on , vol., no., pp. 95,102, 1999.*

(Continued)

*Primary Examiner* — Cynthia Britt

(57) ABSTRACT

A method and apparatus uses a flexible buffering scheme in an XOR engine to generate checksums, allowing a user to recover data when a disk drive partly or completely fails. An XOR engine may include three or more arithmetic units and three or more local result buffers, which may be used to generate a combination of any of a "P" checksum, a "Q" checksum, and an unmodified copy of the user data, in a single read. The local result buffers and arithmetic units allow the use of multiple Galois field Multiply coefficients so that multiple distinct "Q" checksums may be generated with only one read of the user data.

20 Claims, 10 Drawing Sheets

(56) References Cited

U.S. PATENT DOCUMENTS

| | | | |
|---|---|---|---|
| 5,909,384 | A | 6/1999 | Tal et al. |
| 5,978,856 | A | 11/1999 | Jones |
| 6,157,962 | A | 12/2000 | Hodges et al. |
| 6,170,042 | B1 | 1/2001 | Gaertner et al. |
| 6,272,565 | B1 | 8/2001 | Lamberts |
| 6,292,856 | B1 | 9/2001 | Marcotte |
| 6,334,162 | B1 | 12/2001 | Garrett et al. |
| 6,487,615 | B1 | 11/2002 | Hunsaker |
| 6,745,266 | B1 | 6/2004 | Johnson et al. |
| 6,745,303 | B2 | 6/2004 | Watanabe |
| 6,789,132 | B2 | 9/2004 | Hoskins |
| 6,892,250 | B2 | 5/2005 | Hoskins |
| 6,925,539 | B2 | 8/2005 | Mowery et al. |
| 7,043,567 | B2 | 5/2006 | Trantham |
| 7,133,940 | B2 | 11/2006 | Blightman et al. |
| 7,158,324 | B2 | 1/2007 | Stein et al. |
| 7,194,607 | B2 | 3/2007 | Dahlen et al. |
| 7,203,232 | B2 | 4/2007 | Ahn |
| 7,225,391 | B1 | 5/2007 | Bain |
| 7,234,033 | B2 | 6/2007 | Watanabe |
| 7,290,199 | B2 * | 10/2007 | Forhan et al. ............... 714/770 |
| 7,330,068 | B2 | 2/2008 | Barksdale |
| 7,421,614 | B2 | 9/2008 | Watanabe |
| 7,849,259 | B1 | 12/2010 | Wong et al. |
| 7,987,396 | B1 | 7/2011 | Riani |
| 8,099,655 | B1 | 1/2012 | Tan et al. |
| 8,145,976 | B1 | 3/2012 | Yeo |
| 8,156,415 | B1 | 4/2012 | Nguyen et al. |
| 8,370,717 | B1 | 2/2013 | Geddes et al. |
| 8,566,652 | B1 | 10/2013 | Nguyen et al. |
| 8,935,593 | B1 | 1/2015 | Geddes et al. |
| 9,021,147 | B1 | 4/2015 | Nguyen et al. |
| 2006/0004904 | A1 | 1/2006 | Sarangam et al. |
| 2006/0123271 | A1* | 6/2006 | Forhan et al. ............... 714/7 |
| 2006/0146926 | A1 | 7/2006 | Bhoja et al. |
| 2007/0055905 | A1* | 3/2007 | Chou et al. ............... 714/6 |
| 2007/0101075 | A1 | 5/2007 | Jeddeloh |
| 2008/0162806 | A1 | 7/2008 | Gopal et al. |
| 2009/0135035 | A1 | 5/2009 | Fifield |
| 2013/0198434 | A1 | 8/2013 | Mylly et al. |

OTHER PUBLICATIONS

Holland, M.; Gibson, G.A.; Siewiorek, D.P., "Fast, on-line failure recovery in redundant disk arrays," Fault-Tolerant Computing, 1993. FTCS-23. Digest of Papers., The Twenty-Third International Symposium on , vol., no., pp. 422,431, Jun. 22-24, 1993.*

Yu, P.S.; Kun-Lung Wu; Dan, A., "Dynamic Parity Grouping for Improving Write Performance of RAID-5 Disk Arrays," Parallel Processing, 1994. ICPP 1994 vol. 2. International Conference on , vol. 2, no., pp. 193,196, Aug. 15-19, 1994.*

"Non-Final Office Action", U.S. Appl. No. 12/403,243, May 21, 2012, 9 pages.

"Non-Final Office Action", U.S. Appl. No. 13/441,492, Mar. 29, 2013, 5 pages.

"Non-Final Office Action", U.S. Appl. No. 13/748,078, Jun. 27, 2014, 13 pages.

"Non-Final Office Action", U.S. Appl. No. 14/046,696, Sep. 11, 2014, 6 pages.

"Notice of Allowance", U.S. Appl. No. 12/120,483, Nov. 25, 2011, 8 pages.

"Notice of Allowance", U.S. Appl. No. 12/323,267, Dec. 6, 2011, 6 pages.

"Notice of Allowance", U.S. Appl. No. 12/403,243, Sep. 28, 2012, 4 pages.

"Notice of Allowance", U.S. Appl. No. 12/556,483, Mar. 29, 2011, 6 pages.

"Notice of Allowance", U.S. Appl. No. 13/441,492, Jun. 19, 2013, 5 pages.

"Notice of Allowance", U.S. Appl. No. 13/748,078, Sep. 4, 2014, 4 pages.

"Notice of Allowance", U.S. Appl. No. 14/046,696, Jan. 9, 2015, 6 pages.

"Supplemental Notice of Allowance", U.S. Appl. No. 12/323,267, Mar. 15, 2012, 2 pages.

"Supplemental Notice of Allowance", U.S. Appl. No. 13/748,078, Dec. 11, 2014, 2 pages.

Thomasian,"Higher Reliability Redundant Disk Arrays: Organization, Operation, and Coding", ACM Transactions on Storage, vol. 5, No. 3, Article 7, Nov. 2009, pp. 1-59.

* cited by examiner

METHOD AND APPARATUS FOR FLEXIBLE BUFFERS IN AN XOR ENGINE

RELATED APPLICATIONS

This application is a continuation of and claims priority to U.S. Utility application Ser. No. 13/748,078, filed on Jan. 23, 2013, which in turn claims priority to U.S. Utility application Ser. No. 12/403,243, filed on Mar. 12, 2009, now U.S. Pat. No. 8,370,717, which in turn claims priority to U.S. Provisional Patent Application Ser. No. 61/043,227 filed Apr. 8, 2008, the disclosures of which are incorporated by reference herein in their entirety.

BACKGROUND

The present invention relates generally to data recovery, and more particularly to a method and apparatus for using a flexible buffering scheme in an XOR engine to generate checksums in RAID systems, allowing a user to recover data when a disk drive partly or completely fails.

DESCRIPTION OF THE RELATED ART

An exclusive-OR (XOR) engine is a hardware engine which may be used to generate checksums for RAID (redundant array of independent disks) systems. These systems allow a user to recover data if a disk drive partly or completely fails. In such a system, XOR operations are performed on data from plural disk drives, generating a checksum. If one of the disk drives partly or completely fails, a user can XOR the checksum with the remaining original data, thus recreating the lost data. In a RAID system, data may be spread across multiple drives. One or more parity drives may be implemented in a RAID system so that if one of the drives containing data partly or completely fails, any lost data can be reconstructed using the data from the parity drive. Two mathematical mechanisms from which the parity can be generated are a simple XOR of the user data, generating what is known as a "P" checksum, and a Galois field (GF) Multiply and XOR of the user data, generating what is known as a "Q" checksum. In a version of RAID known as RAID 5, "P" checksums can be generated using XOR. In a version of RAID known as RAID 6, "Q" checksums can be generated using a combination of XOR and GF Multiply.

A common RAID 6 system uses a plurality of disk drives, and may have two spare drives. One spare drive contains a "P" checksum, and one spare drive contains a "Q" checksum. Up to two lost data drives can be recreated using the "P" and "Q" checksums. Known hardware implementations allow a user to generate a "P" checksum, a "Q" checksum, or both a single "P" and a single "Q" checksum.

One disadvantage of known XOR engines is that they provide only two local result buffers in the XOR engine, allowing a user to generate at best only one "P" checksum and one "Q" checksum with one read of the user data. Additional operations require additional reads of the user data, thus reducing performance efficiency. Generating different "Q" checksums requires using different GF Multiply coefficients. Another disadvantage of known XOR engines is that they provide only one GF Multiply coefficient for each data source. This same coefficient must be used for each GF Multiply operation, and so using different GF Multiply coefficients requires additional reads of the user data. Thus, the number of "Q" checksums generated per read of the user data is currently limited to one.

Another disadvantage of the conventional technology is that the maximum number of parity drives a user can have if using a "P" checksum is two. A further disadvantage of the conventional technology is that the memory in which the data is stored is typically not fast enough to keep up with the rest of the system. Thus, it is beneficial to minimize the number of reads and writes of the data to the main memory. Another disadvantage is that the user data can only be read from exactly one source and can only be written to exactly one location.

It would be desirable to provide an approach which is sufficiently flexible to accommodate changes over a sufficiently long period of time while particular chips or chipsets are in use for handling RAID storage.

SUMMARY

Embodiments of the present invention overcome the above-mentioned and various other shortcomings of conventional technology, providing a method and apparatus for using a flexible buffering scheme to generate checksums in RAID systems, allowing a user to recover data when a disk drive partly or completely fails. Embodiments of the present invention include an XOR engine that uses three or more arithmetic units and three or more local result buffers to generate a combination of "P" checksums, "Q" checksums, and unmodified copies of user data. The checksums and unmodified copies of user data are generated with a single read of user data from a memory unit, and can be moved to another memory unit. The XOR engine may generate multiple distinct "Q" checksums with only one read of user data by using distinct Galois field (GF) Multiply coefficients. Additional checksums may be generated by additional reads of the user data. The foregoing and other aspects of various embodiments of the present invention will be apparent through examination of the following detailed description thereof in conjunction with the accompanying drawing figures.

DETAILED DESCRIPTION

Figure 1:
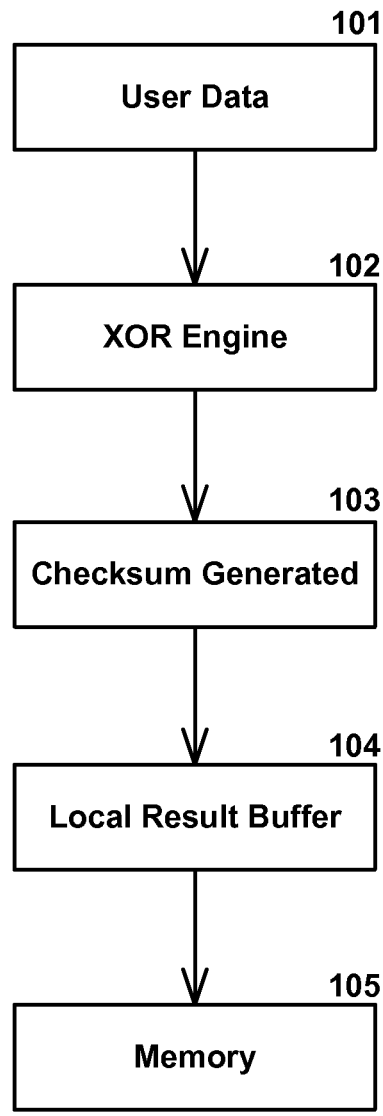
FIG. 1 illustrates a simplified flow chart showing the path of data processed by an XOR engine.
Figure 2:
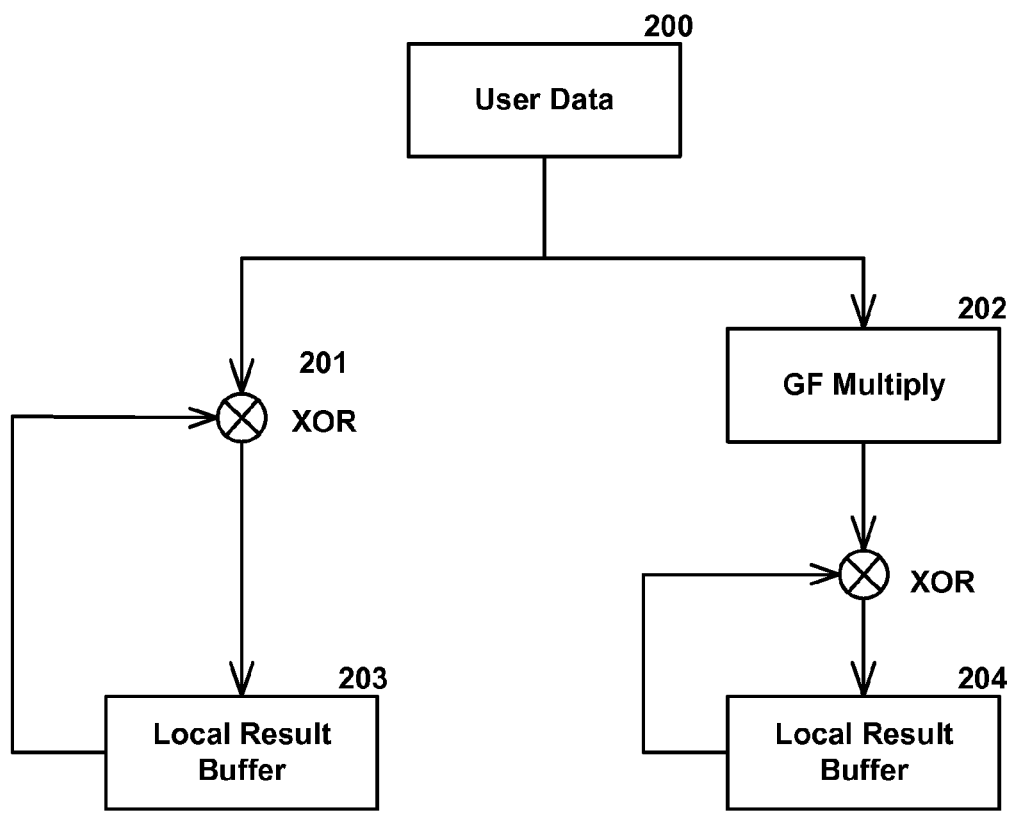
FIG. 2 illustrates a simplified example of a current implementation of an XOR engine.

FIG. 1 is a simplified flow chart showing the path of user data 101 processed by XOR engine 102. User data 101 is read into XOR engine 102, where logic operations are performed on user data 101 to generate a checksum 103, which is stored in local result buffer 104 until it is written to memory 105. FIG. 2 illustrates a current implementation which reads user data 200, performs XOR operation 201 on user data 200 and stores the resulting checksum in a first local result buffer 203, then performs GF Multiply operation 202 on user data 200 and stores the resulting checksum in a second local result buffer 204, and writes the results out to memory.

In accordance with an embodiment of the present invention, the method and apparatus for flexible buffers in an XOR engine may comprise three or more local result buffers, each of which can be configured to generate any of a "P" checksum, a "Q" checksum, or an unmodified copy of the user data, depending on need and availability. For example, it may be desirable to configure the system so that two local result buffers store "Q" checksums and the third local result buffer stores an unmodified copy of the user data. Or, it may be desirable for all three local result buffers to store "Q" checksums, and the use of flexible buffers in an XOR engine allows three "Q" checksums to be generated with a single read of user data. Other configurations will be apparent to ordinarily skilled artisans, and the invention should not be construed as limited to the specific exemplary combinations just mentioned.

Thus, the number of "Q" checksums that can be generated is no longer limited to the number of reads of user data. An embodiment with three local result buffers may be used to generate five "Q" checksums with only two reads of user data. On the first read of user data, two local result buffers may store "Q" checksums and the third local result buffer may store a copy, and on the second read, all three local result buffers may store "Q" checksums, thus generating five "Q" checksums with only two reads.

Generally, the RAID operation performed by the XOR engine takes a number of blocks of user data and performs an XOR operation on all of those blocks, generating a checksum. The original blocks of user data and the checksum are all stored on separate disk drives. If one of the original blocks of user data is lost, the user can read in the remaining blocks, perform an XOR operation on them and XOR the result with the original checksum, thus recreating the lost user data.

Figure 3:
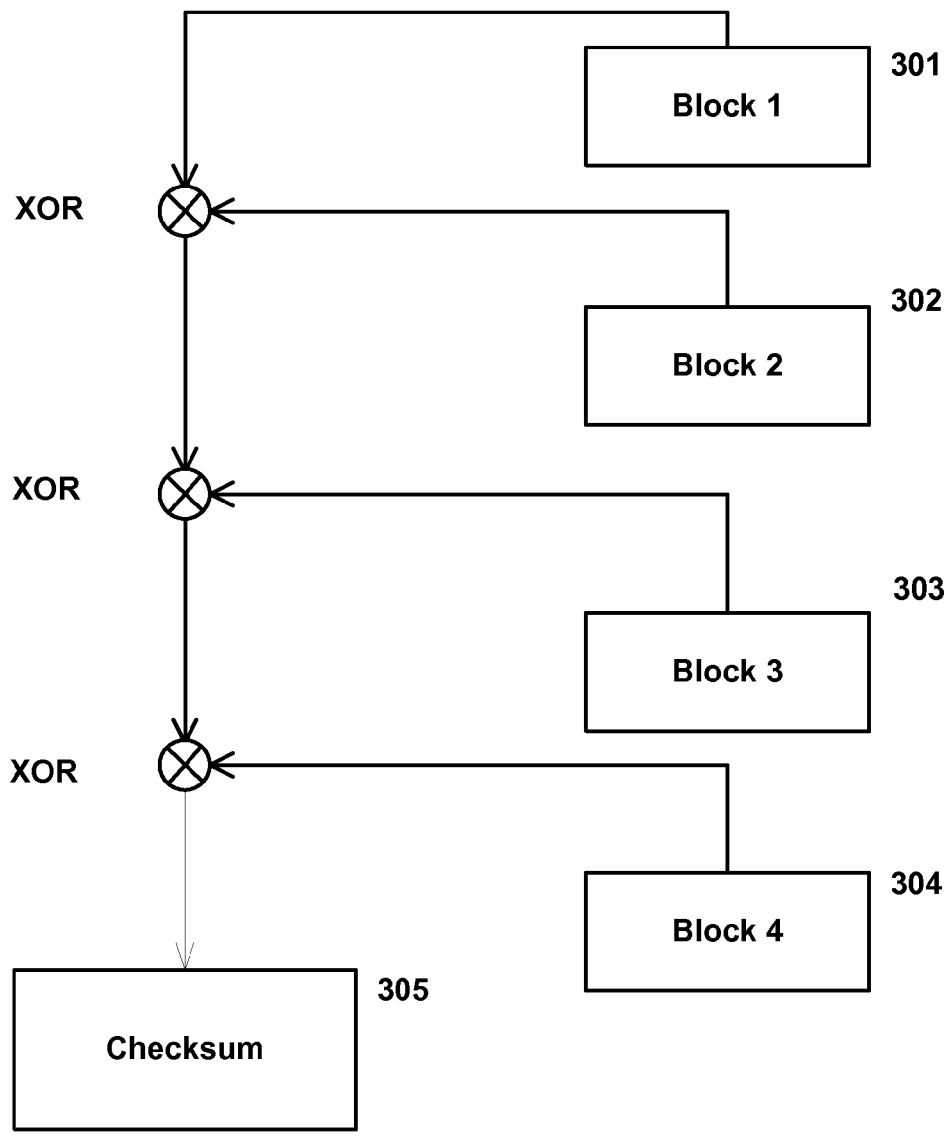
FIG. 3 illustrates a simplified example of a typical RAID 5 operation.

Looking at FIG. 3, to generate a "P" checksum 305, the system may XOR the first block of user data 301 with the second block of user data 302, then XOR that result with the third block of user data 303, then XOR that result with the fourth block of user data 304. If, for example, the fourth block of user data 304 is lost, it can be recreated by an XOR of the first block of user data 301 with the second block of user data 302, an XOR of that result with the third block of user data 303, and an XOR of the result with the "P" checksum 305. Such an XOR operation may be performed in the course of a RAID 5 operation, for example. In this example environment, each of devices 102 includes a wireless transmitter 116, a wireless receiver 118, and a short-range wireless communicator 120. Wireless transmitter 116 is capable of transmitting a wireless-communication signal according to one or more communication protocols, such as those for a wireless LAN (Local Area Network) or a wireless PAN (Personal Area Network). These protocols may include those of the IEEE 802.11 and Bluetooth families of protocols.

Figure 4:
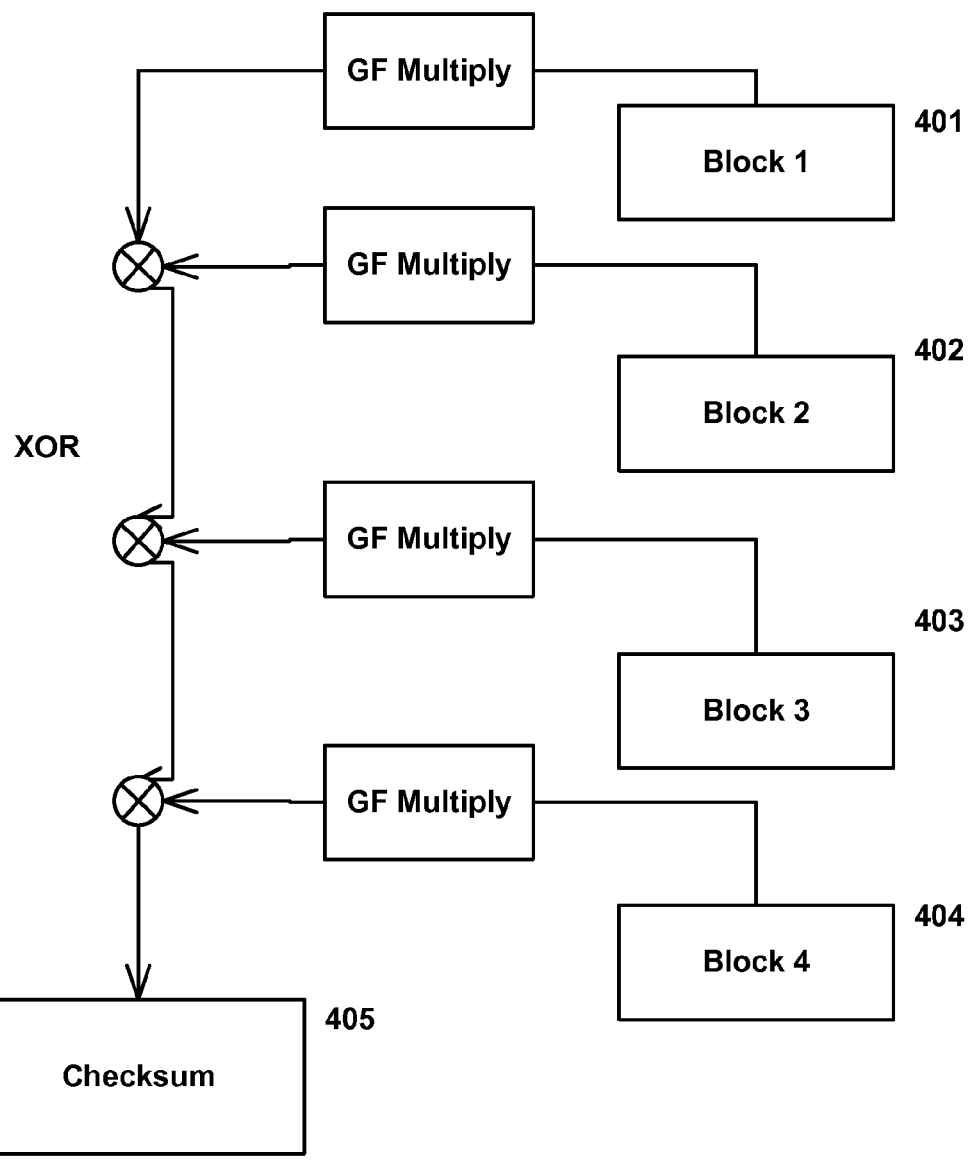
FIG. 4 illustrates a simplified example of a typical RAID 6 operation.

Looking at FIG. 4, to generate a "Q" checksum 405, the system may perform a GF Multiply operation on the first block of user data 401, then XOR that result with the result of the GF Multiply operation performed on the second block of user data 402, then XOR that result with the result of the GF Multiply operation performed on the third block of user data 403, then XOR that result with the result of the GF Multiply operation performed on the fourth block of user data 404. Such an operation may be performed in the course of a RAID 6 operation, for example.

Figure 5:
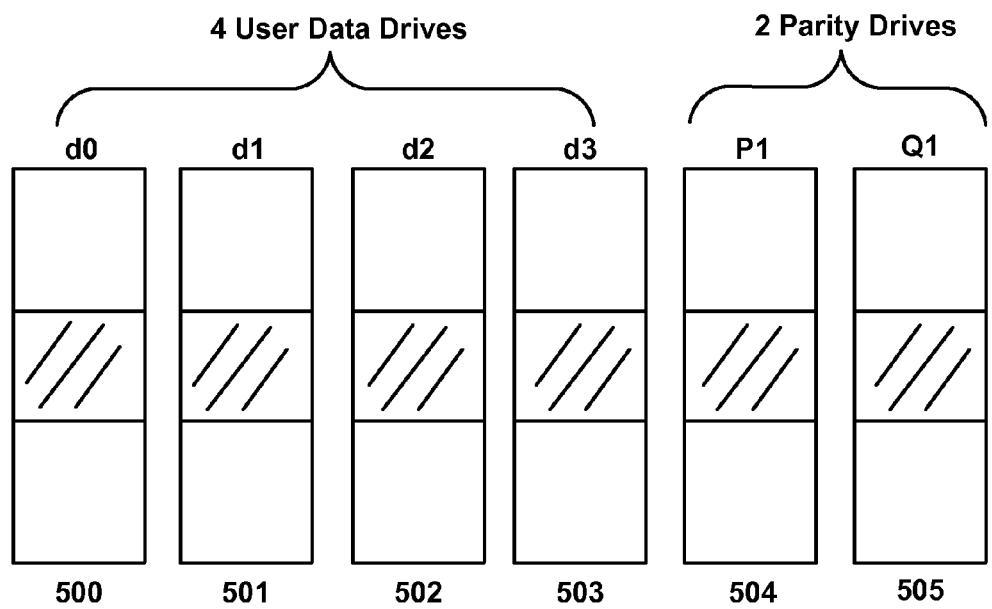
FIG. 5 illustrates a simplified example of a typical RAID 6 configuration.
Figure 6:
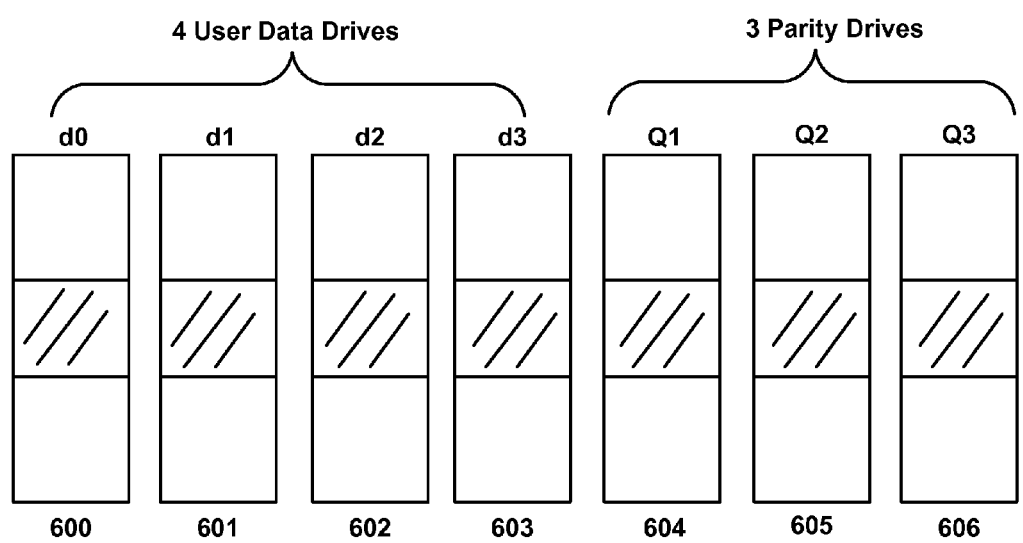
FIG. 6 illustrates a simplified example of a RAID 6 configuration capable of reconstructing data when three drives are lost.

As illustrated in FIG. 5, a typical RAID 6 configuration may contain six separate drives, including four user data drives 500-503 and two parity drives 504-505. Any number of user data drives may be used, and the number of user data drives depicted in FIG. 5 is by way of example only. Or, as illustrated in FIG. 6, a RAID 6 configuration may contain four user data drives 600-603 and three parity drives 604-606. This configuration is capable of reconstructing data when three drives are lost. Any number of user data drives or parity drives may be used, and the number of user data drives and parity drives depicted in FIG. 6 is by way of example only.

Figure 7:
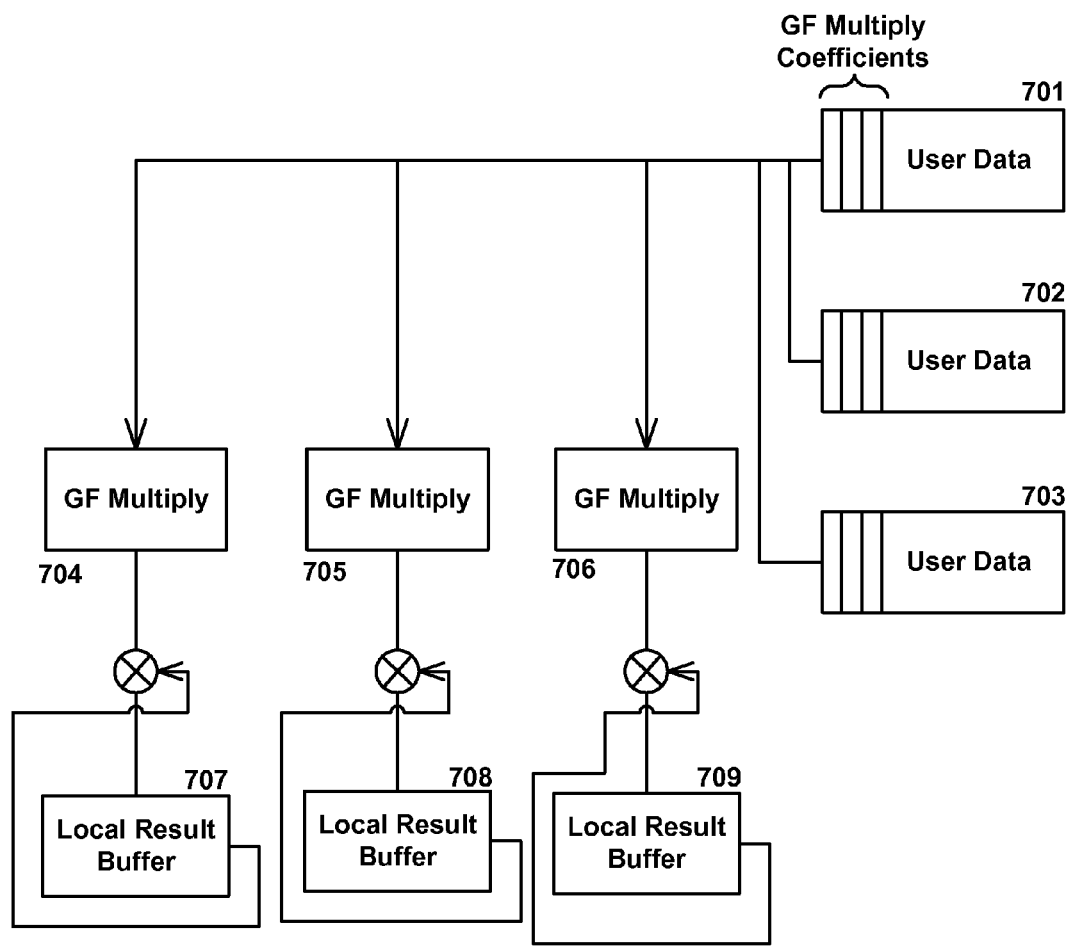
FIG. 7 illustrates one embodiment of the present invention containing three independent local result buffers.

The embodiment illustrated in FIG. 7 contains three independent local result buffers 707-709, and each local result buffer 707-709 has a dedicated independent arithmetic unit 704-706, respectively. While the local result buffers 707-709 and arithmetic units 704-706 in this embodiment are referred to as independent, such independence is not critical to the operation. An embodiment such as FIG. 7 can generate combinations of "P" checksums, "Q" checksums, and unmodified copies of the user data using arithmetic units 704-706, which are each capable of performing both XOR and GF Multiply operations (a GF multiply operation being an operation that a RAID 6 may perform in addition to XOR). Blocks of user data 701-703 represent blocks of user data that are read from memory one at a time. As many as 32 blocks of user data may be used. Each block of user data 701-703 has a set of three distinct GF Multiply coefficients associated with it. Each of these three GF Multiply coefficients corresponds to one of the arithmetic units 704-706, and each GF Multiply coefficient is distinct from the others so that distinct checksums may be generated. The sets of three distinct GF Multiply coefficients may be identical for each block of user data 701-703, or each set may contain different GF Multiply coefficients for each block of user data 701-703. Each arithmetic unit 704-706 can generate from the user data a "P" checksum using XOR operations, a "Q" checksum using GF Multiply and XOR operations, or an unmodified copy of the user data by performing no logic operations. Each such result is stored in the local result buffer 707-709 that is associated with the corresponding arithmetic unit 704-706, respectively.

If the system is told to generate a "Q" checksum, for example, block of user data 701 is read in and is concurrently fed into each arithmetic unit 704-706. Each block of user data 701-703 has a set of three distinct GF Multiply coefficients associated with it. Arithmetic units 704-706 operate in parallel on the block of user data 701, each performing a GF Multiply operation. The results of these GF Multiply operations performed on block of user data 701 are stored in the corresponding local result buffer 707-709 that is associated with the respective arithmetic unit 704-706 that performed the operation. Next, block of user data 702 is read in and is concurrently fed into each arithmetic unit 704-706, which again operate in parallel and perform GF Multiply operations. Each result of these GF Multiply operations performed on block of user data 702 is XOR-ed with the corresponding result of the GF Multiply operation performed on block of user data 701 that was stored in the corresponding local result buffer 707-709, and the result is written to the corresponding local result buffer 707-709. This process is repeated for all blocks of user data. After all blocks of user data are processed, each local result buffer 707-709 contains a different "Q" checksum, which can be written out to memory. Thus, in an embodiment such as FIG. 7, with three local result buffers, this process may occur three times concurrently, each time generating any of a "Q" checksum using different GF Multiply coefficients, a "P" checksum, or an unmodified copy of the user data, which are each stored in the corresponding local result buffer 707-709. Once the operations are performed for all of the blocks of user data 701-703, the results stored in local result buffers 707-709 are written to memory. If a block of user data is later lost, it can be recreated by performing the operation described above, substituting the checksum for the lost block of user data.

By allowing three operations with a single read of user data, the user can for example generate two checksums and move the user data from host memory to internal memory with only a single read of the user data, rather than requiring at least two reads of the user data as before. The ability to use one of the local result buffers as a copy buffer improves the performance of the system, and the ability to generate two or more distinct "Q" checksums enhances data protection capabilities while minimizing the number of times the user data is read from memory. With the three local result buffers 707-709 as shown in FIG. 7, a user could generate with one read of the user data any of the following: one "P" checksum, one "Q" checksum, and one unmodified copy; two "Q" checksums and one "P" checksum; two "Q" checksums and one unmodified copy; or three "Q" checksums. Other configurations will be apparent to ordinarily skilled artisans, and the invention should not be construed as limited to the specific exemplary combinations just mentioned.

Arithmetic units 704-706 can perform either XOR or GF Multiply operations, or allow the user data to pass through unmodified to the corresponding local result buffer 707-709. It is not necessary for the user data to pass through arithmetic units 704-706 when the user data is first read in. The user data can bypass arithmetic units 704-706 and pass directly to the local result buffer 707-709. The arithmetic units 704-706 enable the user to vary the GF Multiply coefficients used for each GF Multiply. In an embodiment with three local result buffers 707-709, each block of user data 701-703 has a set of three GF Multiply coefficients associated with it. Each GF Multiply coefficient in the set is distinct from the others, and each is associated with one of the three arithmetic units 704-706, thus allowing distinct "Q" checksums to be generated. The sets of three distinct GF Multiply coefficients used for each block of user data 701-703 may be identical, or they may contain different GF Multiply coefficients. The ability to use multiple GF Multiply coefficients enables the user to perform multiple GF Multiply operations and generate multiple "Q" checksums with only one read of the user data.

Another advantage of utilizing more than two local result buffers is the ability to use one of the buffers to make an unmodified copy of the user data. For example, a user could store a "P" checksum in local result buffer 707, a "Q" checksum in local result buffer 708, and an unmodified copy of the user data in local result buffer 709. After each block of the unmodified user data is stored in local result buffer 709, the unmodified copy can be written to the main memory unit. Thus, when the operation is complete, the system will have generated two checksums and stored a copy of the user data without having to do more than one read of the user data from a memory unit.

The local result buffers can also vary in size. For example, in a system with a 1K buffer, the XOR engine may first perform the XOR, GF Multiply, or copy operations on the first 1K of each user data block before writing the result to memory, then process the second 1K of each user data block, and so on. The size of the buffers can increase according to the user's needs. A 32K buffer can be useful for large transfers because it provides higher utilization of PCI Express and DDR (double data rate) memory, for example.

Another advantage is that the local result buffers can write out the resulting data to a virtually unlimited number of locations in memory.

Figure 8:
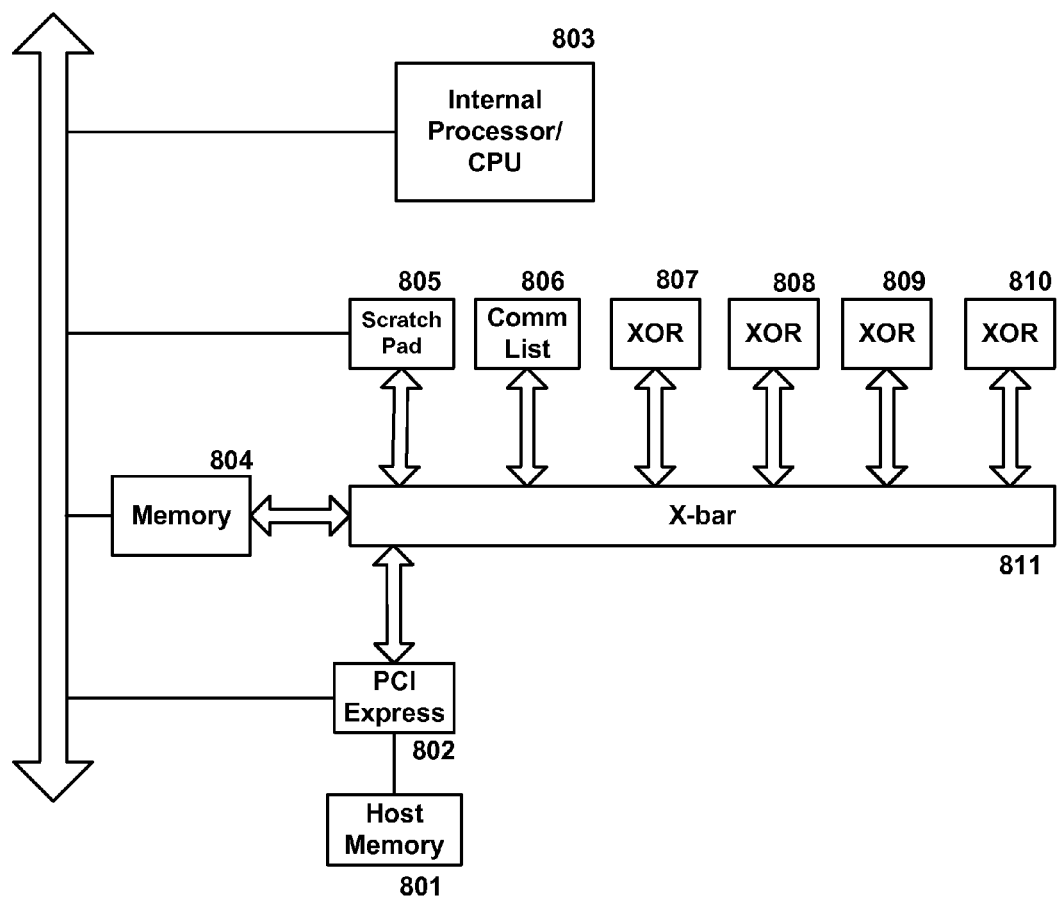
FIG. 8 illustrates an architecture for an XOR engine according to one embodiment of the present invention.

Looking now at an embodiment depicted in FIG. 8, user data may reside in host memory 801. The host can prepare data structures in the host memory to tell the XOR engine whether it will perform a read operation or a write operation, and can create a scatter/gather list that points to locations in host memory where the user data is located. The scatter/gather list and the command may be delivered to the XOR engine using a command list 806. The command list 806 can copy the scatter/gather list and command into an internal scratch pad memory 805, which may comprise for example 1 megabyte of SRAM (static random access memory). Internal processor 803 reads the command to determine how to process the user data. User data thus can be written to disk drives in such a way that if one disk drive crashes, the lost data can be recovered by performing XOR operations on the remaining good data to recreate the data that was lost.

Main memory 804 may be, for example, PBSRAM (Pipeline Burst SRAM) or DDR, depending on the needs and price range of the user. However, main memory can be a bottleneck hindering efficiency. Minimizing the number of read and write accesses to the main memory can improve efficiency. In an embodiment as depicted in FIG. 8, then, the user data passes through a data path to PCI Express bus 802, through a full mesh cross bar 811, and is read into an XOR engine, one of the four such fully independent XOR engines 807-810 depicted in FIG. 8, without first being written to the main memory 804. Using the unmodified copy feature in the XOR engine, the user data can be written to the main memory 804 by the XOR engine. Thus, for example, a "P" checksum and a "Q" checksum can be calculated during the process of moving the user data from host memory 801 to main memory 804, without requiring a second read of the user data for the purpose of generating said "P" checksum and "Q" checksum.

The architecture depicted in FIG. 8 is provided by way of example only. Those of skill in the art will appreciate that the depicted architecture is susceptible of various modifications, including both incorporation of additional elements or devices as well as omission of several of the illustrated components.

The software data structures used to control the hardware XOR engines may be contained in memory, and any memory accessible to the XOR engine could be used for these data structures, such as local scratch pad, host, PBSRAM, or DDR. In one embodiment, illustrated in FIG. 9, the hardware first builds an XOR Command Header 901, located in a circular command list, which describes the type of operation to be executed, such as a "Q," "Q," "Q" operation. XOR Command Header 901 contains pointers to data structures that contain control information for the XOR operation; those data structures are called XOR Tables. For example, XOR Table 902 points to a scatter/gather list, also known as Physical Region Descriptor (PRD) Tables 903-908. PRD Tables 903-908 point to the locations in memory where the user data is located, for example User Data 909-914, and to the locations in memory to which the final checksums will be written. As depicted in FIG. 10, XOR Table 1002 also points to the sets of GF Multiply coefficients 1003-1008 that are associated with each of the six blocks of user data shown.

Figure 9:
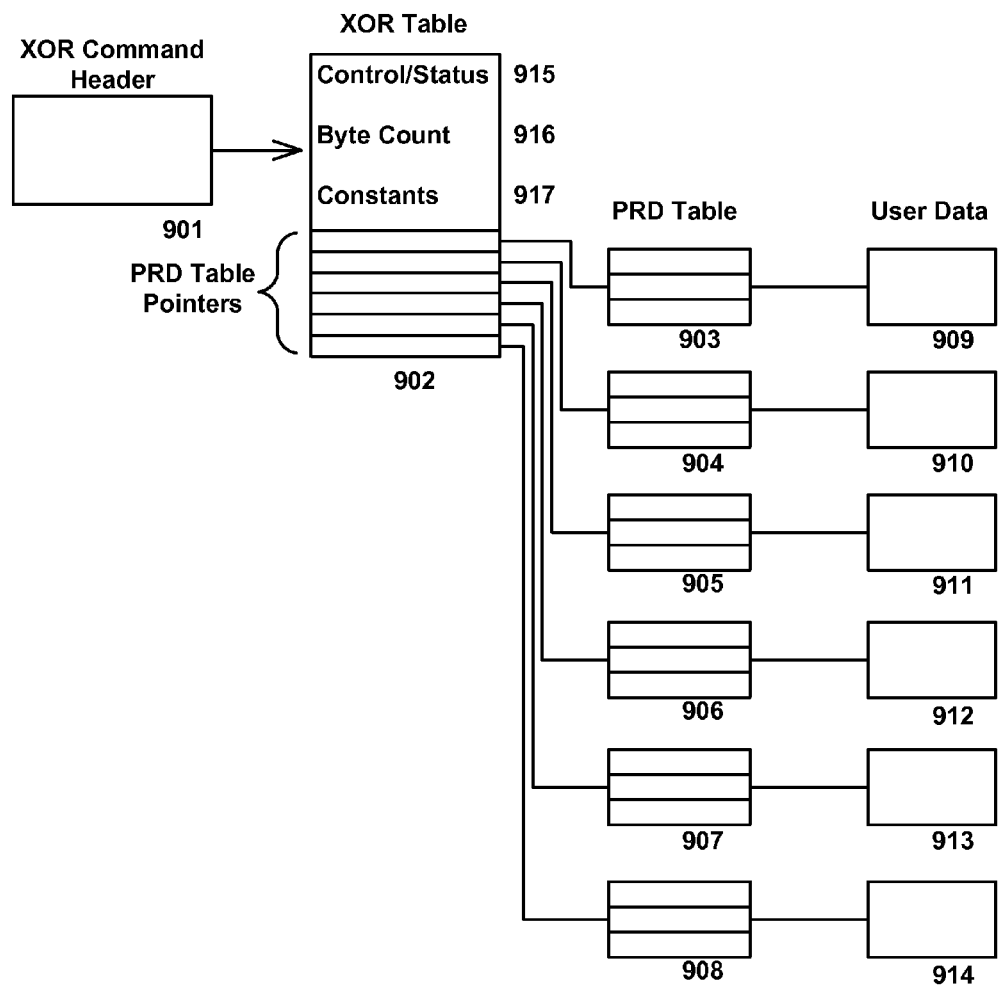
FIG. 9 illustrates a simplified example of a part of one embodiment of the present invention.
Figure 10:
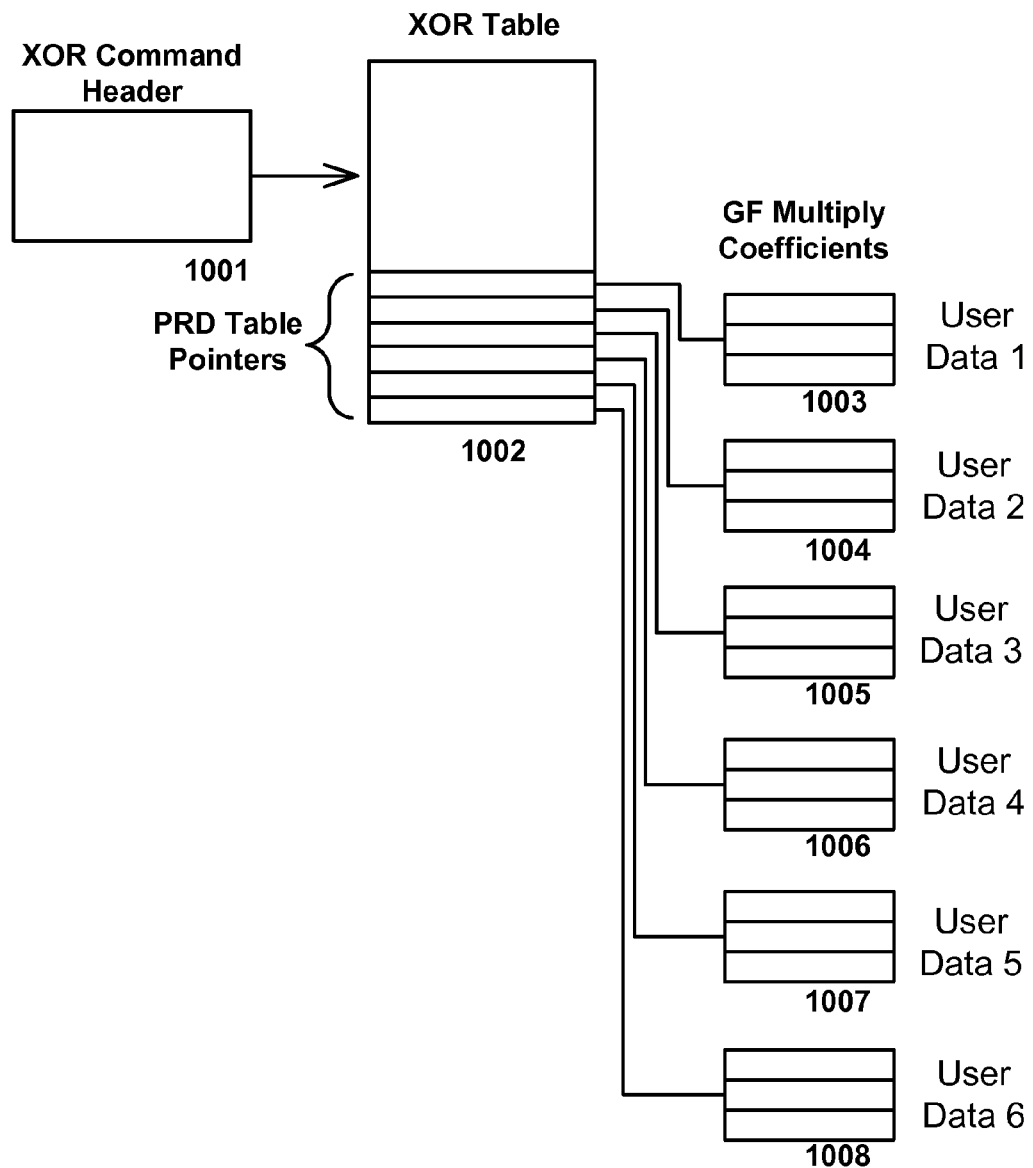
FIG. 10 illustrates a simplified example of a part of one embodiment of the present invention.

In the embodiment depicted in FIG. 9, once the XOR Command Header 901, XOR Table 902, and PRD Tables 903-908 have been generated by the software, an XOR Engine Delivery Queue may be used by the software to notify the XOR engine that an XOR operation is ready for execution. The hardware may then read the Delivery Queue entry and identify which entry in the command list contains the information for the new command and reads in the command list. The command list points to XOR Command Header 901, and once the hardware reads in XOR Command Header 901 it has the information to execute the command. The command processes until all the steps are complete, which includes reading in the user data, performing the XOR, GF Multiply, or copy operations, and storing the results in the local result buffers. The command processes repeat these steps for the user data and write the resulting checksums out to main memory.

The XOR engine supports many types of operations, including data-input operations, data-output operations, and non-data operations. The XOR Tables control the data flow of the XOR operations, through a combination of control and pointer fields. XOR Tables may contain multiple entries, each of which controls an operation on a segment of user data, and may involve one or more of the local result buffers in the XOR engine. The location in memory of the data operated on is contained in a PRD Table, whose address is located in the XOR Table entry. Each XOR Table can support up to thirty-two entries that can each be configured to perform any function, and can each be configured to perform one operation on each of the local result buffers. XOR operations are executed in the order in which they appear in the XOR Table. The XOR Engine Completion Queue is used by the hardware to notify the software that an XOR operation has been completed by the hardware.

The XOR Tables contain the code for whether the system is to generate a "P" or "Q" checksum or make a copy of the user data. For example, XOR Table 902 may contain a Control/Status field 915, which determines the type of operation, "P" or "Q" checksum or copy; a Byte Count field 916, which determines the length of the operation; a Constants field 917, which contains GF Multiply coefficients; and one or more PRD Table Pointers that point to PRD Tables 903-908, which list the user or destination address of the data to be used by the operation. The Constants field 917 may contain the multiple GF Multiply coefficients that allow separate "Q" checksums to be generated concurrently.

The XOR engine can support up to 32 operations. If more operations are required, the user can chain two or more XOR engines together. The software can build multiple XOR Tables and the hardware can execute all of the instructions in the first XOR Table in the chain and then move on to the next XOR Table in the chain, and so forth. This capability minimizes the interaction between the hardware and software, leaving the CPU free to perform other tasks without continuously having to service the hardware.

While the invention has been described in detail above with reference to some embodiments, variations within the scope and spirit of the invention will be apparent to those of ordinary skill in the art. Thus, the invention should be considered as limited only by the scope of the appended claims.

What is claimed is:

1. An apparatus comprising:
   a hardware engine that is configured to generate a first result, a second result, and a third result from the received user data, the first result comprising any of a first type of checksum, a second type of checksum, or an unmodified copy of the received user data, the second result comprising any of the first type of checksum, the second type of checksum, or the unmodified copy of the received user data, and the third result comprising any of the first type of checksum, the second type of checksum, or the unmodified copy of the received user data;
   a first local result buffer configured to store the first result;
   a second local result buffer configured to store the second result; and
   a third local result buffer configured to store the third result.

2. The apparatus of claim 1, wherein the received user data is read into the hardware engine using a single read from a memory unit.

3. The apparatus of claim 1, wherein the first type of checksum comprises a "Q" checksum.

4. The apparatus of claim 1, wherein the second type of checksum comprises a "P" checksum.

5. The apparatus of claim 1, further comprising a plurality of arithmetic units, each of said arithmetic units configured to perform one of a Galois field (GF) Multiply operation, an exclusive-OR (XOR) operation, or a GF Multiply operation followed by an XOR operation.

6. The apparatus of claim 5, wherein the first result is generated by performing the GF Multiply operation followed by the XOR operation.

7. The apparatus of claim 5, wherein the second result is generated by performing the XOR operation.

8. The apparatus of claim 5, wherein the first result is generated by performing the GF multiply operation followed by the XOR operation to generate a "Q" checksum, and wherein the second result is generated by performing the XOR operation to generate a "P" checksum.

9. The apparatus of claim 1, wherein the hardware engine generates a fourth result from the received user data, the fourth result comprising the first type of checksum or the second type of checksum.

10. The apparatus of claim 9, further comprising a fourth local result buffer configured to store any of the first result, the second result, the third result, or the fourth result.

11. A method comprising:
    reading received user data into a hardware engine using a single read from a memory unit;
    generating, by the hardware engine, a first result, a second result, and a third result from the received user data, the first result comprising any of a first type of checksum, a second type of checksum, or an unmodified copy of the received user data, the second result comprising any of the first type of checksum, the second type of checksum, or the unmodified copy of the received user data, and the third result comprising any of the first type of checksum, the second type of checksum, or the unmodified copy of the received user data;
    storing the first result in a first local result buffer;
    storing the second result in a second local result buffer; and
    storing the third result in a third local result buffer.

12. The method of claim 11, wherein the first type of checksum comprises a "Q" checksum.

13. The method of claim 11, wherein the second type of checksum comprises a "P" checksum.

14. The method of claim 11, wherein the first type of checksum is a "Q" checksum generated by performing a Galois field (GF) Multiply operation and an XOR operation on the received user data.

15. The method of claim 11, wherein the second type of checksum is a "P" checksum generated by performing an XOR operation on the received user data.

16. The method of claim 11, wherein the first result is generated by performing a GF multiply operation followed by an XOR operation to generate a "Q" checksum, and wherein the second result is generated by performing an additional XOR operation to generate a "P" checksum.

17. The method of claim 16, further comprising writing the first result, the second result, and the third result to the memory unit.

18. An apparatus comprising:
- a first arithmetic unit configured to perform a Galois field (GF) multiply operation followed by an XOR operation on received user data to generate a first result;
- a second arithmetic unit configured to perform an additional XOR operation on the received user data to generate a second result;
- a first local result buffer configured to store any of the first result, the second result, or an unmodified copy of the received user data;
- a second local result buffer configured to store any of the first result, the second result, or the unmodified copy of the received user data; and
- a third local result buffer configured to store any of the first result, the second result, or the unmodified copy of the received user data.

19. The apparatus of claim 18, wherein the first result comprises a "Q" checksum.

20. The apparatus of claim 18, wherein the second result comprises a "P" checksum.

* * * * *